(12) United States Patent
Ban

(10) Patent No.: US 6,734,530 B2
(45) Date of Patent: May 11, 2004

(54) GAN-BASED COMPOUND SEMICONDUCTOR EPI-WAFER AND SEMICONDUCTOR ELEMENT USING THE SAME

(75) Inventor: Yuzaburo Ban, Hirakata (JP)

(73) Assignee: Matsushita Electric Industries Co., Ltd., Osaka (JP)

( * ) Notice: Subject to any disclaimer, the term of this patent is extended or adjusted under 35 U.S.C. 154(b) by 0 days.

(21) Appl. No.: 10/162,211

(22) Filed: Jun. 5, 2002

(65) Prior Publication Data

US 2003/0001238 A1 Jan. 2, 2003

(30) Foreign Application Priority Data

Jun. 6, 2001  (JP) ........................ 2001-170580

(51) Int. Cl.⁷ .................. H01L 29/04; H01L 31/036
(52) U.S. Cl. ................... 257/628; 257/97; 257/104
(58) Field of Search .................. 257/104, 97, 628

(56) References Cited

U.S. PATENT DOCUMENTS 6,358,822 B1 * 3/2002 Tomomura ................. 438/483
6,452,216 B1 * 9/2002 Tsuda et al. .................. 257/94
6,501,154 B2 * 12/2002 Morita et al. ............... 257/628

FOREIGN PATENT DOCUMENTS

JP    2000-156348    6/2002

OTHER PUBLICATIONS

K. Motoki et al., "Preparation of Large Freestanding GaN Substrates by Hydride Vapor Phase Epitaxy Using GaAs as a Starting Substrate", Japan Journal of Applied Physics, vol. 40(2001), pp. L140–L143, Part 2, No. 2B, Feb. 15, 2001.

* cited by examiner

Primary Examiner—Jerome Jackson
(74) Attorney, Agent, or Firm—McDermott, Will & Emery

(57) ABSTRACT

A GaN-based compound semiconductor epi-wafer includes: a substrate 11 made of a first nitride semiconductor belonging to a hexagonal system; and an element layer 12 for forming a semiconductor element, which is made of a second nitride semiconductor belonging to the hexagonal system and which is grown on a principal surface of the substrate 11. An orientation of the principal surface of the substrate 11 has an off-angle in a predetermined direction with respect to a (0001) plane, and the element layer 12 has a surface morphology of a stripe pattern extending substantially in parallel to the predetermined direction.

10 Claims, 5 Drawing Sheets

GAN-BASED COMPOUND SEMICONDUCTOR EPI-WAFER AND SEMICONDUCTOR ELEMENT USING THE SAME

BACKGROUND OF THE INVENTION

The present invention relates to a GaN-based semiconductor element, such as a GaN-based blue-violet semiconductor laser element, a GaN-based light emitting diode element capable of emitting light in the ultraviolet to red regions, or a GaN-based high frequency electronic device, and to a GaN-based compound semiconductor epitaxially-grown wafer used for forming such a semiconductor element.

A nitride semiconductor containing nitrogen (N) as a group V element has a relatively large band gap and is thus considered a promising material of a short-wavelength light emitting element. Particularly, a gallium nitride (GaN)-based compound semiconductor represented by the general formula $Al_xGa_yIn_zN$ (where $0 \leq x, y, z \leq 1$, $x+y+z=1$) has been actively researched, and a blue light emitting diode (LED) element and a green light emitting diode element have already been put into practical use.

Moreover, there is a strong demand for a blue-violet semiconductor laser element having an oscillation wavelength near 400 nm as a light source for a next-generation high-density optical disk such as an HD-DVD (High Definition Digital Versatile Disk), and semiconductor laser elements using a gallium nitride-based semiconductor material has been actively researched and developed.

FIG. 5 is an enlarged perspective view illustrating a portion of an epitaxially-grown wafer (hereinafter referred to simply as "epi-wafer") used in a conventional gallium nitride-based compound semiconductor device.

As illustrated in FIG. 5, the orientation of the principal surface of a substrate 101 made of gallium nitride (GaN) has an off-angle of 0.2° in the crystal zone axis <1-100> direction with respect to the (0001) plane. An element layer 102 made of an epitaxially-grown gallium nitride-based semiconductor is formed on the principal surface of the substrate 101.

The surface morphology of the element layer 102 is influenced by steps (not shown) on the surface of the substrate 101, and has a plurality of steps appearing in the same direction (=<1-100> direction). Thus, a plurality of steps are formed in the direction in which the off-angle is provided to the orientation of the principal surface of the substrate 101. Note that in the present specification, the negative symbol "–" attached to an index of an orientation or crystal zone axis is used herein for the sake of convenience to represent the inversion of the index that follows the negative symbol.

In a case where a semiconductor laser element is produced by using such an epi-wafer, it is produced so that the laser resonance direction in a cavity of a waveguide and the step direction (=<1-100> direction) are substantially perpendicular to each other. If the resonance direction of the cavity (stripe direction) is aligned with the step direction of the substrate 101 (off-angle direction), the end surfaces of the cavity opposing each other are shifted from each other in height due to the steps, thereby increasing the internal loss (waveguide loss). This increases the threshold current of the laser element, whereby the reliability is also lowered.

Incidentally, Japanese Laid-Open Patent Publication No. 2000-156348 describes a GaN-based compound semiconductor epi-wafer in which an element layer is formed, wherein the element layer has steps in which the width of a flat portion (terrace portion) between adjacent steps is on the order of 100 to 1000 µm.

In the publication, the resonance direction is set to be parallel to the step direction so as to allow for cleavage along the (1-100) M plane of GaN. Therefore, the width of the terrace portion needs to be at least large enough to be cut out as a chip, i.e., to be larger than the length of one side of the chip.

However, with the GaN-based compound semiconductor epi-wafer of the publication, the off-angle needs to be very small, i.e., about 0.3° to 0.5°, so as to form a terrace portion that is large enough to obtain a laser chip.

Therefore, since the off-angle cannot be larger than 1°, for example, the surface morphology of the epi-wafer may deteriorate, and the half-width of the X-ray rocking curve, which is an index of the orientation of a crystal, may increase, thereby failing to obtain an element layer having a high crystallinity. Therefore, a semiconductor device produced by using the conventional GaN-based compound semiconductor epi-wafer will have insufficient characteristics.

SUMMARY OF THE INVENTION

The present invention, which has been made to solve the problems in the prior art, has an object to obtain a high crystallinity in an epitaxial layer (element layer) of a GaN-based compound semiconductor epi-wafer having an off-angle.

In order to achieve the object, a GaN-based compound semiconductor epi-wafer of the present invention includes: a substrate made of a first nitride semiconductor belonging to a hexagonal system; and an element layer for forming a semiconductor element, which is made of a second nitride semiconductor belonging to the hexagonal system and which is grown on a principal surface of the substrate, wherein: an orientation of the principal surface of the substrate has an off-angle in a predetermined direction with respect to a (0001) plane; and the element layer has a surface morphology of a stripe pattern extending substantially in parallel to the predetermined direction.

With the GaN-based compound semiconductor epi-wafer of the present invention, the element layer has a surface morphology of a stripe pattern extending substantially in parallel to the predetermined direction, in which the off-angle is provided, whereby the width between stripes (the width of the terrace portion) will never be narrowed even if the off-angle of the substrate is set to be as large as 1° or more. Therefore, the element layer has a desirable surface morphology, and an element layer having a good crystallinity can be obtained. Note that a surface morphology of a stripe pattern is a step that is formed by one or two atomic layers and is present on the surface of the element layer.

In the GaN-based compound semiconductor epi-wafer of the present invention, it is preferred that the predetermined direction is a crystal zone axis <1-100> direction.

In the GaN-based compound semiconductor epi-wafer of the present invention, it is preferred that the off-angle is equal to or greater than 1° and less than or equal to 10°.

A semiconductor element of the present invention is a semiconductor element using a GaN-based compound semiconductor epi-wafer, the GaN-based compound semiconductor epi-wafer including: a substrate made of a first nitride semiconductor belonging to a hexagonal system; and an element layer made of a second nitride semiconductor belonging to the hexagonal system for forming the semiconductor element, the element layer being grown on a principal surface of the substrate, wherein: an orientation of the principal surface of the substrate has an off-angle in a predetermined direction with respect to a (0001) plane; and the element layer has a surface morphology of a stripe pattern extending substantially in parallel to the predetermined direction.

With the semiconductor element of the present invention, the element layer has a surface morphology of a stripe pattern extending substantially in parallel to the predetermined direction, in which the off-angle is provided, whereby the width between stripes will not be narrowed even if the off-angle of the substrate is set to be as large as 1° or more. Therefore, the element layer has a desirable surface morphology, and an element layer having a good crystallinity can be obtained.

In the semiconductor element of the present invention, it is preferred that the predetermined direction is a crystal zone axis <1-100> direction.

In the semiconductor element of the present invention, it is preferred that the off-angle is equal to or greater than 1° and less than or equal to 10°.

It is preferred that the semiconductor element of the present invention is a laser element.

In such a case, it is preferred that the laser element includes a cavity formed to be substantially parallel to the predetermined direction.

In such a case, it is preferred that: the off-angle is equal to or greater than 1° and less than or equal to 10°; and end surfaces of the cavity are formed by cleavage.

Moreover, it is preferred that the semiconductor element of the present invention is a light emitting diode element.

DETAILED DESCRIPTION OF THE INVENTION

First Embodiment

The first embodiment of the present invention will now be described with reference to the drawings.

Figure 1:
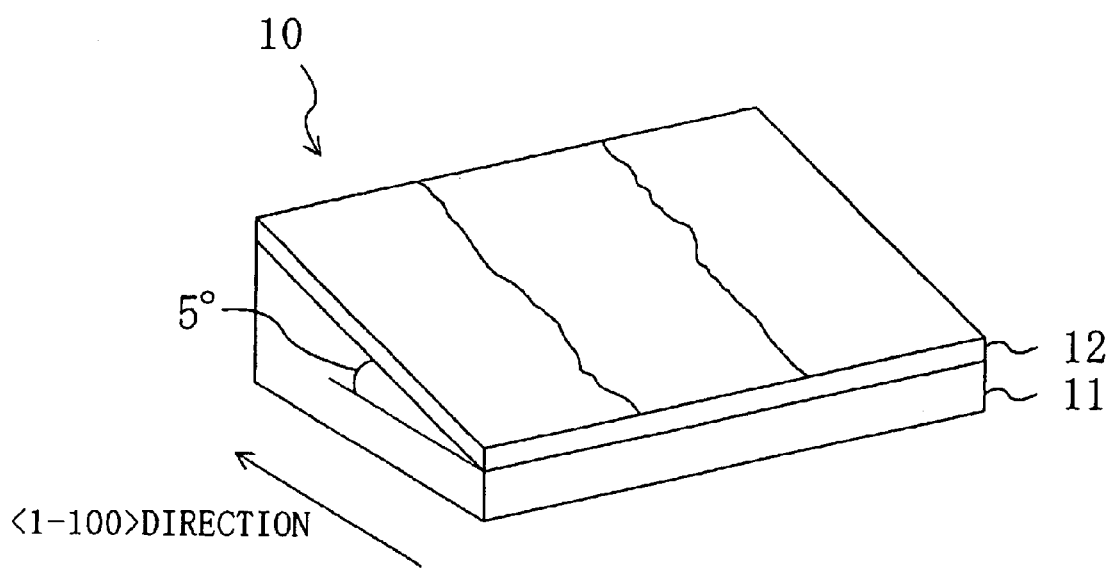
FIG. 1 is an enlarged perspective view illustrating a portion of a GaN-based compound semiconductor epi-wafer according to the first embodiment of the present invention.

FIG. 1 is an enlarged perspective view illustrating a portion of a GaN-based compound semiconductor epi-wafer according to the first embodiment of the present invention.

As illustrated in FIG. 1, an epi-wafer 10 of the first embodiment includes a substrate 11 made of gallium nitride (GaN) which, in terms of crystal system, belongs to the hexagonal system and whose principal surface is inclined by an off-angle of 5° in the crystal zone axis <1-100> direction with respect to the (0001) plane, and an element layer 12 for forming a semiconductor element, which is made of a GaN-based compound semiconductor belonging to the hexagonal system, and which is epitaxially grown by using a metalorganic vapor phase epitaxy (MOVPE) method, or the like, on the principal surface of the substrate 11.

The surface morphology of the element layer 12 is a stripe pattern extending substantially in parallel to the crystal zone axis <1-100> direction, and the interval between the stripes is about 10 $\mu$m to 20 $\mu$m.

Note that although the substrate 11 is not limited to a liquid phase growth, a vapor phase growth or a solid phase growth, it is herein formed by, for example, a high-temperature high-pressure method, an MOVPE method, a hydride vapor phase epitaxy (HVPE) method, or the like.

A measurement of the X-ray rocking curve of the epi-wafer 10 having the element layer 12 has confirmed that the half-width thereof is about 100 seconds or less. In a conventional epi-wafer, the off-angle of the principal surface is smaller than 1°, as described above, and the half-width of the X-ray rocking curve is about 200 seconds to 300 seconds. Thus, it can be seen that the epi-wafer 10 of the first embodiment has a significantly improved crystallinity as compared with the conventional epi-wafer having an off-angle smaller than 1°.

It has been confirmed that if the off-angle of the substrate 11 made of gallium nitride is set to be about on the order of 1 degree, e.g., to be equal to or greater than 1° and less than or equal to 10°, the surface morphology of the element layer 12 epitaxially grown on the substrate 11 will be a stripe pattern extending substantially in parallel to the <1-100> direction, which is the off-angle direction, whereby the crystallinity of the element layer 12 is significantly improved.

Note that while an MOVPE method is used as an epitaxial growth method for forming the element layer 12 in the first embodiment, the present invention is not limited to this. The present invention can of course be realized by using other epitaxial growth methods, e.g., a molecular beam epitaxy (MBE) method, or an HVPE method.

Second Embodiment

The second embodiment of the present invention will now be described with reference to the drawings.

Figure 2:
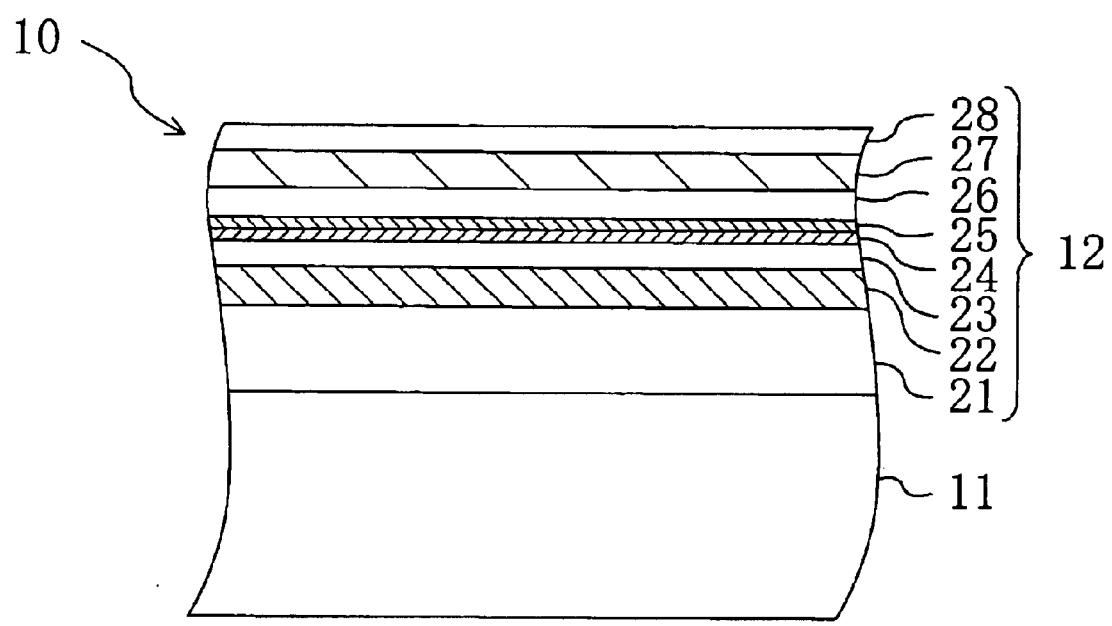
FIG. 2 is a cross-sectional view illustrating a portion of a GaN-based compound semiconductor epi-wafer according to the second embodiment of the present invention.

FIG. 2 is a cross-sectional view illustrating a portion of a GaN-based compound semiconductor epi-wafer according to the second embodiment of the present invention.

In FIG. 2, the element layer 12 made of a GaN-based compound semiconductor of the second embodiment is an epitaxial layer having a semiconductor laser structure capable of emitting violet light.

As illustrated in FIG. 2, the GaN-based compound semiconductor epi-wafer 10 has a structure in which an n-type semiconductor layer 21 made of n-type GaN, an n-type cladding layer 22 made of n-type aluminum gallium nitride (AlGaN), an n-type light guide layer 23 made of n-type GaN, a multiple quantum well (MQW) active layer 24 including well layers made of indium gallium nitride (InGaN) and barrier layers made of GaN that are layered together, a p-type cap layer 25 made of p-type AlGaN, a p-type light guide layer 26 made of p-type GaN, a p-type cladding layer 27 made of p-type AlGaN, and a p-type contact layer 28 made of p-type GaN, are layered in this order, by epitaxial growth, on the principal surface of the substrate 11 made of gallium nitride (GaN) whose principal surface is inclined by an off-angle of about 2° in the crystal zone axis <1-100> direction with respect to the (0001) plane.

The n-type cladding layer 22 and the p-type cladding layer 27 confine carriers injected into the MQW active layer 24 and recombined light caused by the carriers, and the n-type light guide layer 23 and the p-type light guide layer 26 improve the efficiency of confining the carriers and the recombined light. Moreover, the p-type cap layer 25 functions as a barrier layer for preventing electrons injected from the n-type semiconductor layer 21 from leaking to the p-type light guide layer 26, instead of being injected into the MQW active layer 24.

The resonance direction (longitudinal direction) of the cavity is set to be a direction perpendicular to the M plane, which is a crystal face of gallium nitride, i.e., the crystal zone axis <1-100> direction, so that the cleaved end surface of the cavity provided in the semiconductor laser structure is the M plane.

Herein, since the off-angle direction of the substrate 11 is also in the <1-100> direction, the surface morphology of the element layer 12 epitaxially grown on the substrate 11 is a stripe pattern extending substantially in parallel to the off-angle direction (<1-100> direction), as described above, whereby the longitudinal direction, so called "stripe direction", of the cavity coincides with the direction in which the stripe pattern extends. Therefore, since the width of a portion between adjacent stripes (terrace portion) is 10 µm to 20 µm, and the cavity width is normally about 2 µm to 3 µm, it is possible to reliably form a cavity in the terrace portion.

Note that although the off-angle of the principal surface of the substrate 11 is set to be about 2° in the second embodiment, the present invention is not limited to this as long as it is equal to or greater than 1° and less than or equal to 10°.

Moreover, in the MQW active layer 24, each well layer is made of InGaN and each barrier layer is made of GaN. Alternatively, each well layer may be made of GaN, and each barrier layer may be made of AlGaN.

Moreover, each of the n-type cladding layer 22 and the p-type cladding layer 27 may alternatively be a superlattice cladding layer including an AlGaN layer and a GaN layer that are layered together, instead of being an AlGaN single layer. Herein, in a case where a superlattice cladding layer is used, doping of an impurity such as silicon (Si), which is an n-type dopant, or magnesium (Mg), which is a p-type dopant, can be performed for at least one of the AlGaN layer and the GaN layer.

Third Embodiment

The third embodiment of the present invention will now be described with reference to the drawings.

Figure 3:
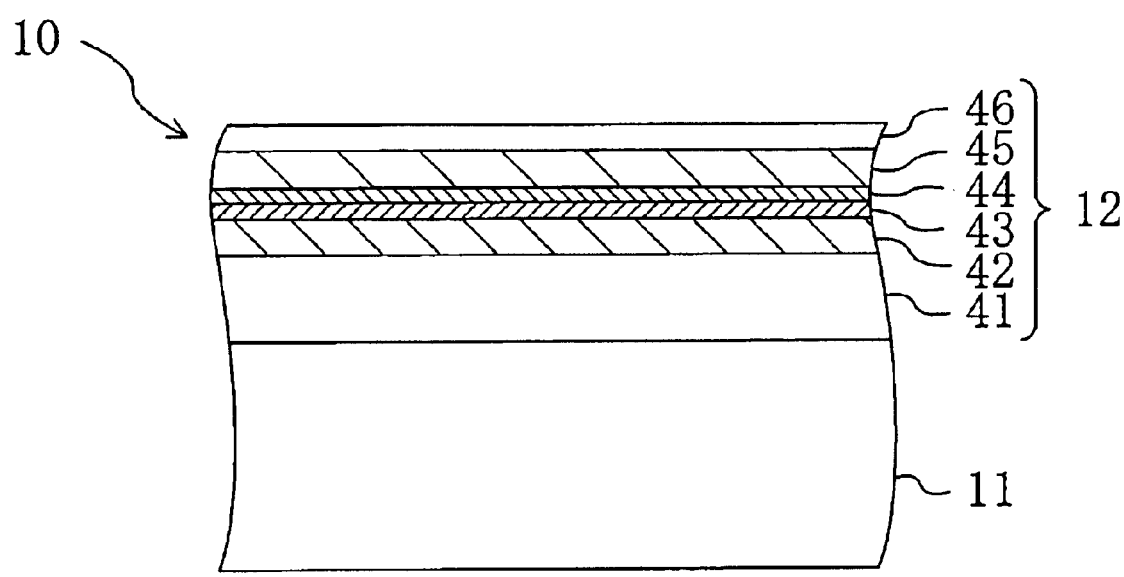
FIG. 3 is a cross-sectional view illustrating a portion of a GaN-based compound semiconductor epi-wafer according to the third embodiment of the present invention.

FIG. 3 is a cross-sectional view illustrating a portion of a GaN-based compound semiconductor epi-wafer according to the third embodiment of the present invention.

In FIG. 3, the element layer 12 made of a GaN-based compound semiconductor of the third embodiment is an epitaxial layer having a light emitting diode structure capable of emitting blue light.

As illustrated in FIG. 3, the GaN-based compound semiconductor epi-wafer 10 has a structure in which an n-type semiconductor layer 41 made of n-type GaN, an n-type superlattice cladding layer 42 including an n-type InGaN layer and an n-type GaN layer that are layered together, a multiple quantum well (MQW) active layer 43 including well layers made of InGaN and barrier layers made of GaN that are layered together, a p-type cap layer 44 made of p-type AlGaN, a p-type superlattice cladding layer 45 including a p-type AlGaN layer and a p-type GaN layer that are layered together, and a p-type contact layer 46 made of p-type GaN, are layered in this order, by epitaxial growth, on the principal surface of the substrate 11 made of gallium nitride (GaN) whose principal surface is inclined by an off-angle of about 2° in the crystal zone axis <1-100> direction with respect to the (0001) plane.

Also in the third embodiment, the surface morphology of the element layer 12 is a stripe pattern extending substantially in parallel to the off-angle direction (<1-100> direction), and the half-width of the X-ray rocking curve is reduced to about 80 seconds, thereby considerably improving the crystallinity as compared with that in the prior art. As a result, it has been confirmed that the light-emitting efficiency of a GaN-based blue light emitting diode element produced by using an epi-wafer of the third embodiment is significantly increased.

Note that although the off-angle in the principal surface of the substrate 11 is set to be about 2° also in the third embodiment, the present invention is not limited to this as long as it is equal to or greater than 1° and less than or equal to 10°.

Moreover, in the MQW active layer 43, each well layer is made of InGaN and each barrier layer is made of GaN. Alternatively, each well layer may be made of GaN, and each barrier layer may be made of AlGaN.

Moreover, the n-type cladding layer 42 has a superlattice structure including an n-type InGaN layer and an n-type GaN layer that are layered together. Alternatively, it may have a superlattice structure including an n-type AlGaN layer and an n-type GaN layer, or a single-layer structure made of n-type GaN or n-type AlGaN.

Moreover, the p-type cladding layer 45 has a superlattice structure including a p-type AlGaN layer and a p-type GaN layer that are layered together. Alternatively, it may have a single-layer structure made of p-type GaN or p-type AlGaN.

Note that as in the second embodiment, impurity doping of an n-type dopant or a p-type dopant can be performed for at least one of the well layer or the barrier layer in the superlattice structure.

EXAMPLES

First Example

The first example of the present invention will now be described with reference to the drawings.

Figure 4:
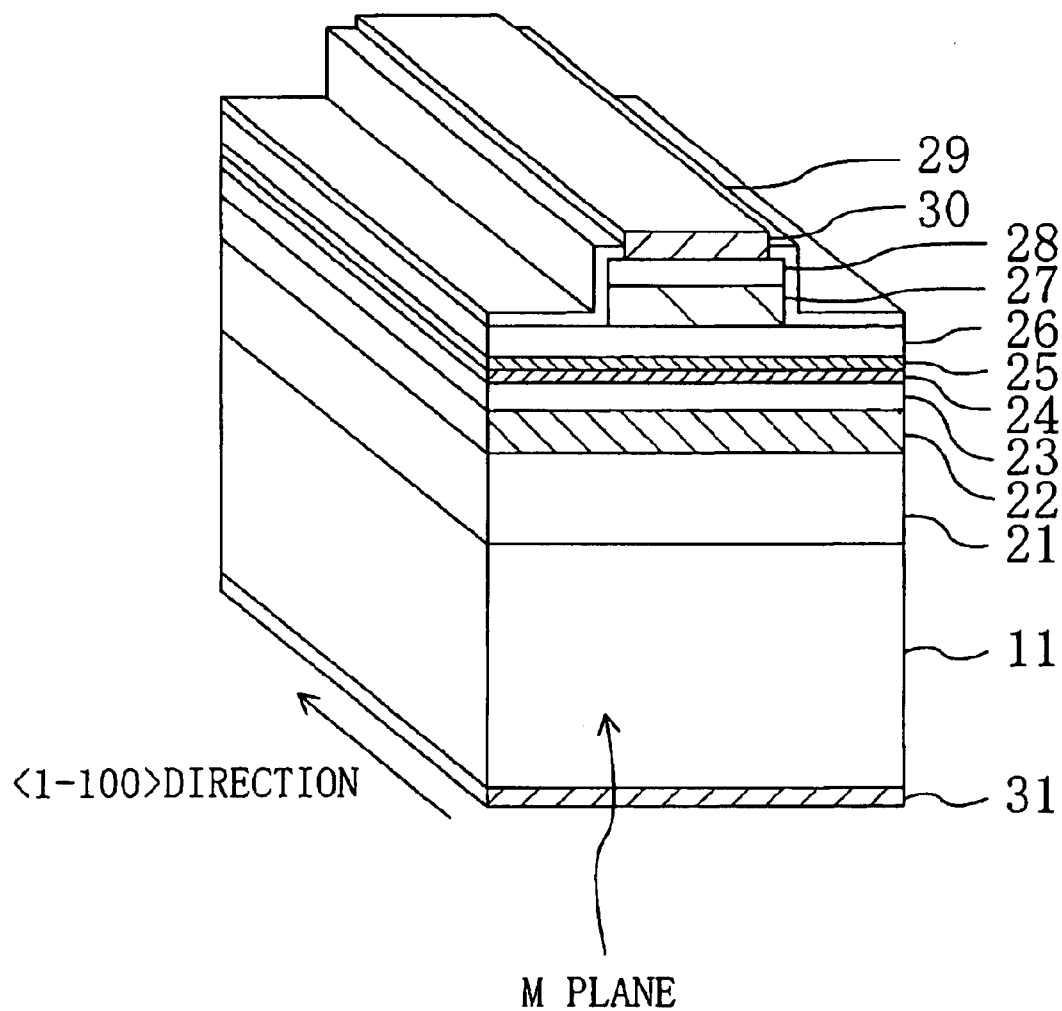
FIG. 4 is a perspective view illustrating a violet semiconductor laser element produced by using a GaN-based compound semiconductor epi-wafer according to the first example of the present invention.
Figure 5:
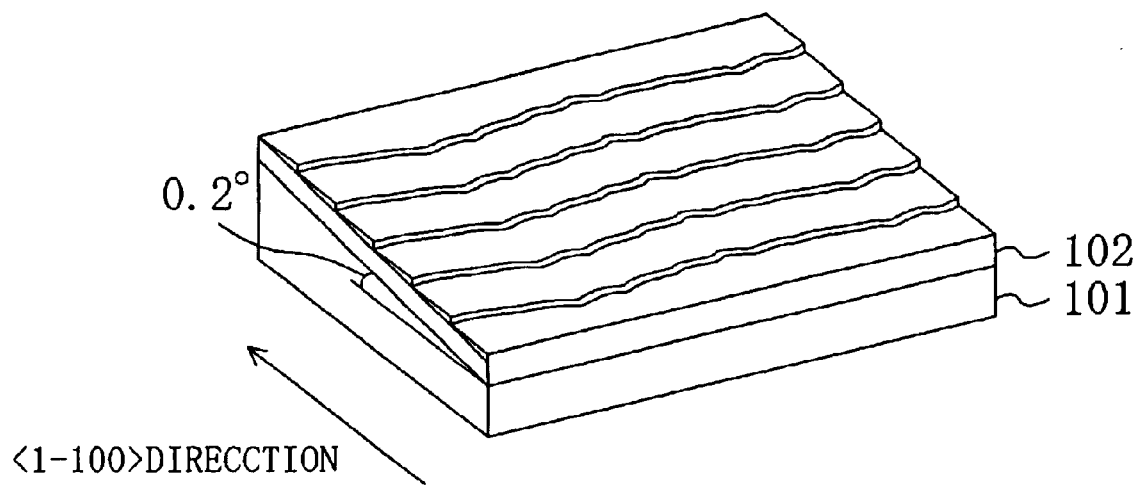
FIG. 5 is an enlarged perspective view illustrating a portion of a conventional GaN-based compound semiconductor epi-wafer.

FIG. 4 is a perspective view illustrating the first example of the present invention, i.e., a violet semiconductor laser element produced by using a GaN-based compound semiconductor epi-wafer according to the second embodiment.

The first example employs, as a crystal growth method for the element layer, an MOVPE method performed under a growth pressure of 300 Torr (1 Torr=133.322 Pa), which is a depressurized condition.

A material gas made of trimethylaluminum (TMAl: $(CH_3)_3Al$), trimethylgallium (TMGa: $(CH_3)_3Ga$) or trimethylindium (TMIn: $(CH_3)_3In$) is used as a group III source. Moreover, an ammonia ($NH_3$) gas is used as a group V source. Monosilane ($SiH_4$), for example, is used as an n-type impurity material, and cyclopentadienyl magnesium ($Cp_2Mg$: $(C_5H_5)_2Mg$), for example, is used as a p-type impurity material. A hydrogen ($H_2$) gas and a nitrogen ($N_2$) gas are used as carrier gases for these material gases.

Moreover, the substrate 11 made of gallium nitride (GaN) whose principal surface is inclined by an off-angle of about 2° in the <1-100> direction with respect to the (0001) plane is used as a substrate for the element layer.

First, an example of a growth process of the element layer 12 illustrated in FIG. 2 will be described.

The substrate 11 is placed into a reaction chamber of an MOVPE apparatus, and then the substrate 11 is heated to about 1050° C., which is the growth temperature for the element layer 12. Herein, when the substrate temperature reaches about 400° C., the supply of an $NH_3$ gas is started so that the surface of the substrate 11 will not be degenerated by heat. After passage of a few minutes since when the substrate temperature reaches about 1050° C., the supply of TMGa and an $SiH_4$ gas is started so as to grow the n-type semiconductor layer 21 made of n-type GaN having a thickness of about 3 μm on the principal surface of the substrate 11. Then, the supply of TMAl is started so as to grow the n-type cladding layer 22 made of n-type AlGaN having a thickness of about 0.7 μm on the n-type semiconductor layer 21. Then, the supply of TMAl is stopped so as to grow the n-type light guide layer 23 made of n-type GaN having a thickness of about 10 nm.

Then, after the growth temperature is decreased to about 800° C., the MQW active layer 24 is grown on the n-type light guide layer 23. Specifically, TMGa, TMIn and $NH_3$ are supplied so as to grow a well layer made of InGaN having a thickness of about 3 nm, and TMGa and $NH_3$ are supplied so as to grow a barrier layer made of GaN having a thickness of about 7.5 nm. These well layers and barrier layers are layered alternately on one another so as to obtain the MQW active layer 24 including three pairs of these layers.

Then, after the growth temperature is increased to 1000° C., TMAl, TMGa, $NH_3$ and $Cp_2Mg$ are supplied so as to grow the p-type cap layer 25 made of p-type AlGaN having a thickness of about 2 nm on the MQW active layer 24. Then, the supply of TMAl is stopped, and the p-type light guide layer 26 made of p-type GaN having a thickness of about 10 nm is grown on the p-type cap layer 25. Then, the supply of TMAl is resumed so as to grow the p-type cladding layer 27 made of p-type AlGaN having a thickness of about 0.5 μm on the p-type light guide layer 26. Then, the supply of TMAl is stopped so as to grow the p-type contact layer 28 made of p-type GaN having a thickness of about 0.2 μm on the p-type cladding layer 27.

Then, after the p-type contact layer 28 is grown, the supply of the material gas of TMGa, $Cp_2Mg$ and $NH_3$ is stopped, and the intermediate product is cooled to room temperature while continuing to supply the carrier gas of $N_2$ and $H_2$, after which the epi-wafer 10 is taken out of the reaction chamber.

The surface morphology of the epi-wafer 10 of the first example thus formed shows a stripe pattern extending substantially in parallel to the off-angle direction of the principal surface of the substrate 11, i.e., the crystal zone axis <1-100> direction, as illustrated in FIG. 1.

Moreover, the half-width of the X-ray rocking curve obtained from the epi-wafer 10 is about 80 seconds.

Next, an example of a method for manufacturing the violet semiconductor laser element illustrated in FIG. 4 will be described with reference to the drawings.

First, a mask forming film (not shown) made of silicon oxide ($SiO_2$) is deposited across the entire surface of the p-type contact layer 28 by using a sputtering method or a CVD method, and then the mask forming film is patterned into a ridge stripe shape by using a photolithography method, thereby forming a mask film for a dry etching process from the mask forming film. Then, the p-type contact layer 28 and the p-type cladding layer 27 are etched by a reactive ion etching method using the formed mask film to a degree such that the p-type light guide layer 26 is exposed, thereby transferring the ridge stripe shape of the mask film onto the p-type contact layer 28 and the p-type cladding layer 27.

Then, after the mask film is removed, a protection insulative film 29 made of silicon oxide is deposited on the upper surface and the side surface of the p-type contact layer 28 and the p-type cladding layer 27, which have been etched, and on the exposed portion of the p-type light guide layer 26, after which an opening through which the p-type contact layer 28 is exposed is selectively formed in the protection insulative film 29 by using a photolithography method and a dry etching method.

Then, a resist pattern having an opening in the region where the p-type contact layer 28 is exposed is formed by using a photolithography method. Then, nickel (Ni) and gold (Au) are vapor-deposited in this order by using a vapor deposition method, or the like, after which a p-side electrode 30 including Ni and Au layered together and being in an ohmic contact with the p-type contact layer 28 is formed by using a lift-off method.

Then, the surface (reverse surface) of the substrate 11 opposite to the element layer 12 is polished until the thickness thereof is about 100 μm. Then, titanium (Ti) and aluminum (Al) are vapor-deposited in this order on the reverse surface by using a vapor deposition method, or the like, thereby forming an n-side electrode 31 including Ti and Al layered together and being in an ohmic contact with the substrate 11.

Then, the epi-wafer 10 is cleaved along the M plane so as to form a bar-shaped semiconductor layered structure that includes a plurality of cavities with the end surfaces of each cavity being exposed. Then, the reflection end surface (rear surface) of the cleavage surfaces is coated with a high reflection film made of a dielectric film whose reflectance is about 80%, and the emission end surface (front surface) opposing the reflection end surface is coated with a low reflection film made of a dielectric film whose reflectance is about 20%. Then, the bar-shaped semiconductor layered structure is divided into chips so that each chip includes at least one cavity.

A GaN-based violet semiconductor laser element thus produced had an oscillation wavelength of 405 nm, and an evaluation on the laser light output characteristics and the current characteristics showed desirable characteristics, including a threshold current of about 45 mA and a threshold voltage of about 4.5 V. Thus, the operating current and the operating voltage when the optical output is 30 mW can be reduced, and thus the power to be input is reduced, thereby improving the reliability and realizing a prolongation of the operating lifetime.

Note that while the MQW active layer 24 includes well layers made of InGaN and barrier layers made of GaN, it may alternatively include well layers made of GaN or AlGaN and barrier layers made of n-type AlGaN, in which case it is possible to obtain laser light having an oscillation wavelength in the ultraviolet region.

Moreover, while an n-type impurity is not doped into either one of the well layer and the active layer of the MQW active layer 24 in the first example, an n-type conductivity may be exhibited in some cases due to diffusion from the n-type light guide layer 23 during the growth process. Note however that an impurity may be actively doped into at least one of the well layers and the active layers during the growth of the MQW active layer 24.

Second Example

The second example of the present invention will now be described with reference to the drawings.

The second example shows an example of a method for manufacturing a blue light emitting diode element produced by using a GaN-based compound semiconductor epi-wafer according to the second embodiment.

Again, an MOVPE method performed under a growth pressure of 300 Torr, which is a depressurized condition, is used as a crystal growth method for the element layer.

A material gas made of trimethylaluminum (TMAl), trimethylgallium (TMGa) or trimethylindium (TMIn) is used as a group III source, as in the first example. Moreover, an ammonia ($NH_3$) gas is used as a group V source. Monosilane ($SiH_4$), for example, is used as an n-type impurity material, and cyclopentadienyl magnesium ($Cp_2Mg$), for example, is used as a p-type impurity material. Moreover, a hydrogen gas and a nitrogen gas are used as carrier gases for these material gases.

The substrate 11 made of gallium nitride (GaN) whose principal surface is inclined by an off-angle of about 5° in the <1-100> direction with respect to the (0001) plane is used as a substrate on which the element layer is grown.

First, the substrate 11 is placed into a reaction chamber of an MOVPE apparatus, and then the substrate 11 is heated to about 1050° C., which is the growth temperature for the element layer 12. Herein, when the substrate temperature reaches about 400° C., the supply of an $NH_3$ gas is started so that the surface of the substrate 11 will not be degenerated by heat. After passage of a few minutes since when the substrate temperature reaches about 1050° C., the supply of TMGa and an $SiH_4$ gas is started so as to grow the n-type semiconductor layer 41 made of n-type GaN having a thickness of about 3 µm on the principal surface of the substrate 11.

Then, the n-type superlattice cladding layer 42 made of n-type GaN/undoped InGaN is grown on the n-type semiconductor layer 41. Specifically, TMGa, $NH_3$ and $SiH_4$ are supplied so as to grow a barrier layer made of n-type GaN having a thickness of about 2.5 nm, and TMGa, TMIn and $NH_3$ are supplied so as to grow a well layer made of undoped InGaN having a thickness of about 2.5 nm. These barrier layers and well layers are further layered alternately on one another.

Then, the growth temperature is decreased to about 800° C., and then the MQW active layer 43 is grown on the n-type superlattice cladding layer 42. Specifically, TMGa, TMIn and $NH_3$ are supplied so as to grow a well layer made of InGaN having a thickness of about 3 nm, and TMGa, $NH_3$ and $SiH_4$ are supplied so as to grow a barrier layer made of n-type GaN having a thickness of about 7.5 nm. These well layers and barrier layers are layered alternately on one another so as to obtain the MQW active layer 43 including five pairs of these layers.

Then, after the growth temperature is increased to 1000° C., TMAl, TMGa, $NH_3$ and $Cp_2Mg$ are supplied so as to grow the p-type cap layer 44 made of p-type AlGaN having a thickness of about 2 nm on the MQW active layer 43.

Then, the p-type superlattice cladding layer 45 made of p-type AlGaN/undoped GaN is grown on the p-type cap layer 44. Specifically, TMGa, TMAl, $NH_3$ and $Cp_2Mg$ are supplied so as to grow a barrier layer made of p-type AlGaN having a thickness of about 2.5 nm, and TMGa and $NH_3$ are supplied so as to grow a well layer made of GaN having a thickness of about 2.5 nm. These barrier layers and well layers are further layered alternately on one another.

Then, TMGa, $NH_3$ and $Cp_2Mg$ are supplied so as to grow the p-type contact layer 46 made of p-type GaN having a thickness of about 0.2 µm on the p-type superlattice cladding layer 45.

Then, although not shown, a p-side electrode is formed on the p-type contact layer, and an n-side electrode is formed on the surface of the substrate 11 opposite to the element layer 12, after which the substrate 11 is divided into chips of an intended size.

The surface morphology of the epi-wafer 10 of the second example thus formed shows a stripe pattern extending substantially in parallel to the off-angle direction of the principal surface of the substrate 11, i.e., the <1-100> direction, as illustrated in FIG. 1.

Moreover, the half-width of the X-ray rocking curve obtained from the epi-wafer 10 is about 80 seconds, indicating a good crystallinity.

Note that in the n-type superlattice cladding layer 42, only the GaN layer, which is a barrier layer, is doped with an impurity, and also in the p-type superlattice cladding layer 45, only the AlGaN layer, which is a barrier layer, is doped with an impurity. However, the present invention is not limited to this, as long as at least one of the barrier layer and the well layer is doped.

Moreover, in the MQW active layer 43, only the GaN layer, which is a barrier layer, is doped with an impurity. However, the present invention is not limited to this, as long as at least one of the barrier layer and the well layer is doped, or the barrier layer and the well layer may be both undoped.

Note that the superlattice layers 42 and 45 and the MQW active layer 43 are not substantially doped with an impurity during the crystal growth process, as described above. However, due to diffusion of an impurity during or after the crystal growth process from a semiconductor layer that is adjacent to these undoped layers and that is doped with an impurity, the impurity may be contained in the undoped layers. Therefore, in the present specification, an undoped layer is not limited to a semiconductor layer that is not substantially doped with an impurity during the crystal growth process, but may include a semiconductor layer that contains an impurity from an adjacent semiconductor layer as a result of diffusion.

What is claimed is:

1. A GaN-based compound semiconductor epi-wafer, comprising:
    a substrate made of a first nitride semiconductor belonging to a hexagonal system; and
    an element layer for forming a semiconductor element, which is made of a second nitride semiconductor belonging to the hexagonal system and which is grown on a principal surface of the substrate, wherein:
        an orientation of the principal surface of the substrate has an off-angle in a predetermined direction with respect to a (0001) plane; and
        the element layer has a surface morphology of a stripe pattern extending substantially in parallel to the predetermined direction.

2. The GaN-based compound semiconductor epi-wafer of claim 1, wherein the predetermined direction is a crystal zone axis <1-100> direction.

3. The GaN-based compound semiconductor epi-wafer of claim 1, wherein the off-angle is equal to or greater than 1° and less than or equal to 10°.

4. A semiconductor element using a GaN-based compound semiconductor epi-wafer, the GaN-based compound semiconductor epi-wafer including:
    a substrate made of a first nitride semiconductor belonging to a hexagonal system; and
    an element layer made of a second nitride semiconductor belonging to the hexagonal system for forming the semiconductor element, the element layer being grown on a principal surface of the substrate, wherein:

an orientation of the principal surface of the substrate has an off-angle in a predetermined direction with respect to a (0001) plane; and the element layer has a surface morphology of a stripe pattern extending substantially in parallel to the predetermined direction.

5. The semiconductor element of claim 4, wherein the predetermined direction is a crystal zone axis <1-100> direction.

6. The semiconductor element of claim 4, wherein the off-angle is equal to or greater than 1° and less than or equal to 10°.

7. The semiconductor element of claim 4, wherein the semiconductor element is a laser element.

8. The semiconductor element of claim 7, wherein the laser element includes a cavity formed to be substantially parallel to the predetermined direction.

9. The semiconductor element of claim 8, wherein:

the off-angle is equal to or greater than 1° and less than or equal to 10°; and end surfaces of the cavity are formed by cleavage.

10. The semiconductor element of claim 4, wherein the semiconductor element is a light emitting diode element.

* * * * *